United States Patent
Naruse

(10) Patent No.: US 9,449,784 B2
(45) Date of Patent: Sep. 20, 2016

(54) CHARGED PARTICLE BEAM INSTRUMENT AND SAMPLE CONTAINER

(71) Applicant: JEOL Ltd., Tokyo (JP)

(72) Inventor: Tatsuo Naruse, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/520,754

(22) Filed: Oct. 22, 2014

(65) Prior Publication Data

US 2015/0137000 A1 May 21, 2015

(30) Foreign Application Priority Data

Oct. 28, 2013 (JP) .................................. 2013-223337

(51) Int. Cl.
| | |
|---|---|
| H01J 37/00 | (2006.01) |
| H01J 37/20 | (2006.01) |
| H01J 37/18 | (2006.01) |
| H01J 37/26 | (2006.01) |

(52) U.S. Cl.
CPC ................ *H01J 37/20* (2013.01); *H01J 37/18* (2013.01); *H01J 37/261* (2013.01); *H01J 2237/002* (2013.01); *H01J 2237/2002* (2013.01); *H01J 2237/26* (2013.01); *H01J 2237/2602* (2013.01)

(58) Field of Classification Search
USPC .................................................... 250/441.11
See application file for complete search history.

(56) References Cited

U.S. PATENT DOCUMENTS

| | | | | |
|---|---|---|---|---|
| 4,886,571 A | * | 12/1989 | Suzuki .................... | C23C 16/44 118/724 |
| 5,751,003 A | * | 5/1998 | Rose ....................... | H01J 27/14 250/442.11 |
| 6,593,152 B2 | * | 7/2003 | Nakasuji .............. | G01N 23/225 250/492.3 |
| 8,530,865 B2 | * | 9/2013 | Shichi .................... | H01J 27/26 250/309 |
| 2007/0029504 A1 | * | 2/2007 | Saito ...................... | H01J 37/18 250/441.11 |

FOREIGN PATENT DOCUMENTS

JP 201337841 A 2/2013

* cited by examiner

*Primary Examiner* — Phillip A Johnston
(74) *Attorney, Agent, or Firm* — The Webb Law Firm

(57) ABSTRACT

A charged particle beam instrument is offered which can introduce cooled samples easily into a sample chamber. The charged particle beam instrument (100) of the present invention has: a sample container (10) that accommodates samples (S) and a refrigerant (6) for cooling the samples (S); an evacuated sample chamber (20); a sample exchange chamber (30) connected with the sample chamber (20); a partition valve (40) disposed between the sample exchange chamber (30) and the sample container (10); and vacuum pumping equipment (50) for evacuating the sample container (10). The sample container (10) can be connected with the sample exchange chamber (30) via the partition valve (40). The sample container (10) is evacuated by the vacuum pumping equipment (50) while the partition valve (40) is closed.

7 Claims, 12 Drawing Sheets

CHARGED PARTICLE BEAM INSTRUMENT AND SAMPLE CONTAINER

BACKGROUND OF THE INVENTION

1. Field of the Invention

The present invention relates to a charged particle beam instrument and a sample container.

2. Description of Related Art

Where a sample is observed with a charged particle beam instrument such as an electron microscope, if the sample is a biological sample or a polymeric material, and if the sample is irradiated with a charged particle beam (such as an electron beam), the structure of the sample may be destroyed and thus the sample under normal conditions may not be observed. In this case, where the sample is cooled below the temperature of liquid nitrogen (for example, a cryogenic temperature), even if the sample is irradiated with a charged particle beam such as an electron beam, the sample will be destroyed less easily. The sample under normal conditions can be observed.

However, when a sample is cooled and introduced into a sample chamber such as of an electron microscope that is in a vacuum state, various contrivances have been made to prevent crystalline ice or frost from being deposited on the sample (see, for example, JP-A-2013-037841).

SUMMARY OF THE INVENTION

The present invention has been made in view of the foregoing problems. One object associated with some aspects of the present invention is to provide a charged particle beam instrument permitting cooled samples to be introduced into a sample chamber easily.

Another object associated with some aspects of the invention is to provide a sample container capable of introducing cooled samples into a chamber of a charged particle beam instrument easily.

(1) A charged particle beam instrument associated with the present invention has: a sample container that accommodates samples and a refrigerant for cooling the samples; an evacuated sample chamber; a sample exchange chamber connected with the sample chamber; a partition valve disposed between the sample exchange chamber and the sample container; and vacuum pumping equipment for evacuating the sample container. The sample container can be connected with the sample exchange chamber via the partition valve. The sample container is evacuated by the vacuum pumping equipment while the partition valve is closed.

In this charged particle instrument, the sample container is evacuated by the vacuum pumping equipment while the partition valve is closed. Therefore, the partition valve can be opened after the interior of the sample container is evacuated and the refrigerant is solidified. Consequently, the samples can be introduced into the sample exchange chamber from the sample container even if the refrigerant is left in the sample container. This facilitates insertion of the cooled samples into the sample chamber.

(2) In one feature of this charged particle beam instrument, the sample container may have a sample-receiving space for receiving the samples, a refrigerant-receiving space for receiving the refrigerant, and a thermally conductive member that partitions the sample-receiving space and the refrigerant-receiving space from each other. The thermally conductive member may be provided with communication holes for placing the sample-receiving space and the refrigerant-receiving space in communication with each other.

In this charged particle beam instrument, if the sample container is evacuated and the refrigerant solidifies, it is possible to prevent adhesion of the solidified refrigerant onto the samples.

(3) In another feature of this charged particle beam instrument, the sample exchange chamber may have a sample storage portion capable of holding the samples. There may be further provided a cooling portion for cooling the sample storage portion.

In this charged particle beam instrument, the samples can be kept in the sample exchange chamber while being cooled.

(4) In a further feature of this charged particle beam instrument, there may be further provided first and second transfer rods. The first transfer rod conveys the samples between the sample container and the sample exchange chamber. The second transfer rod conveys the samples between the first transfer rod and the sample storage portion.

In this charged particle beam instrument, the samples can be conveyed from the sample container into the sample storage portion, and vice versa.

(5) In a still other feature of this charged particle beam instrument, the second transfer rod may operate to convey the samples between the sample storage portion and the sample chamber.

In this charged particle beam instrument, the samples can be conveyed either from the sample container or from the sample storage portion into the sample chamber, and vice versa.

(6) In an additional feature of this charged particle beam instrument, the refrigerant may be evacuated by the vacuum pumping equipment and become solidified.

In this charged particle beam instrument, the cooled samples can be easily introduced into the sample chamber.

(7) In a still further feature of this charged particle beam instrument, the refrigerant may be any one of liquid nitrogen, liquid methane, liquid ethane, and liquid butane.

In this charged particle beam instrument, the refrigerant can be solidified by evacuating the sample container. This permits the cooled samples to be introduced into the sample chamber easily.

(8) Another charged particle beam instrument associated with the present invention has: an evacuated sample chamber; a sample exchange chamber connected with the sample chamber; a sample storage portion formed in the sample exchange chamber and capable of holding samples therein; and a cooling portion for cooling the sample storage portion.

In this charged particle beam instrument, the samples can be kept in the sample exchange chamber while being cooled. Therefore, the cooled samples can be easily introduced into the sample chamber.

(9) A sample container associated with the present invention can be connected via a partition valve with a sample exchange chamber in a charged particle beam instrument. The sample container includes a sample-receiving space for receiving samples, a refrigerant-receiving space for receiving a refrigerant, and a thermally conductive member that partitions the sample-receiving space and the refrigerant-receiving space from each other. The thermally conductive member may be provided with communication holes for placing the sample-receiving space and the refrigerant-receiving space in communication with each other.

With this sample container, even if the sample container is evacuated and the refrigerant becomes solidified, adhesion of the solidified refrigerant onto the samples can be prevented. Accordingly, when this sample container is connected with the sample exchange chamber via the partition valve, the refrigerant can be solidified by evacuating the container while the partition valve is closed. Consequently, the samples can be introduced into the sample exchange chamber from the sample container without bringing the sample exchange chamber to atmospheric pressure. Hence, the cooled samples can be easily introduced into the sample chamber.

(10) In one feature of this sample container, the refrigerant-receiving space is evacuated, whereby the refrigerant is solidified.

With this sample container, the cooled samples can be easily introduced into the sample chamber.

(11) In another feature of this sample container, the refrigerant may be any one of liquid nitrogen, liquid methane, liquid ethane, and liquid butane.

With this sample container, the refrigerant can be solidified by evacuating the sample container. This permits the cooled samples to be introduced into the sample chamber easily.

DESCRIPTION OF THE INVENTION

The preferred embodiments of the present invention are hereinafter described in detail with reference to the drawings. It is to be understood that the embodiments provided below do not unduly restrict the scope of the present invention delineated by the appended claims and that not all the configurations described below are essential constituent components of the invention.

1. Charged Particle Beam Instrument

Figure 1:
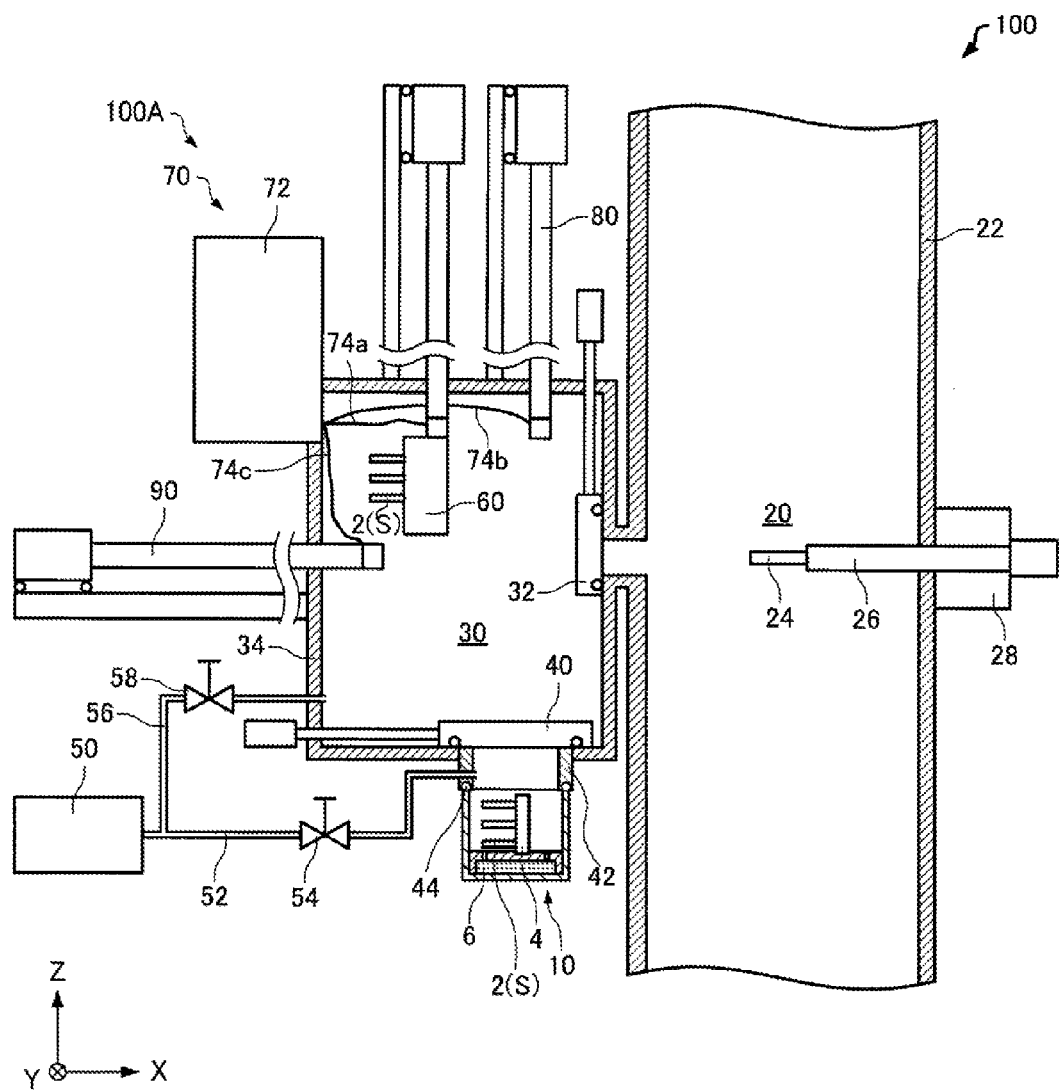
FIG. 1 is a vertical cross section, party in block form, of main portions of a charged particle beam instrument associated with one embodiment of the present invention.

The configuration of a charged particle beam instrument associated with one embodiment of the present invention is first described by referring to FIG. 1, which schematically shows main portions of the charged particle beam instrument, 100. In FIG. 1, X-, Y-, and Z-axes are shown as mutually perpendicular axes.

As shown in FIG. 1, the charged particle beam instrument 100 is configured including a sample container 10, a sample chamber 20, and a sample exchange device 100A. In the present embodiment, it is assumed that the charged particle beam instrument 100 is a transmission electron microscope (TEM). FIG. 1 shows the state in which the sample container 10 has been attached to the sample exchange device 100A.

(1) Sample Container

Figure 2:
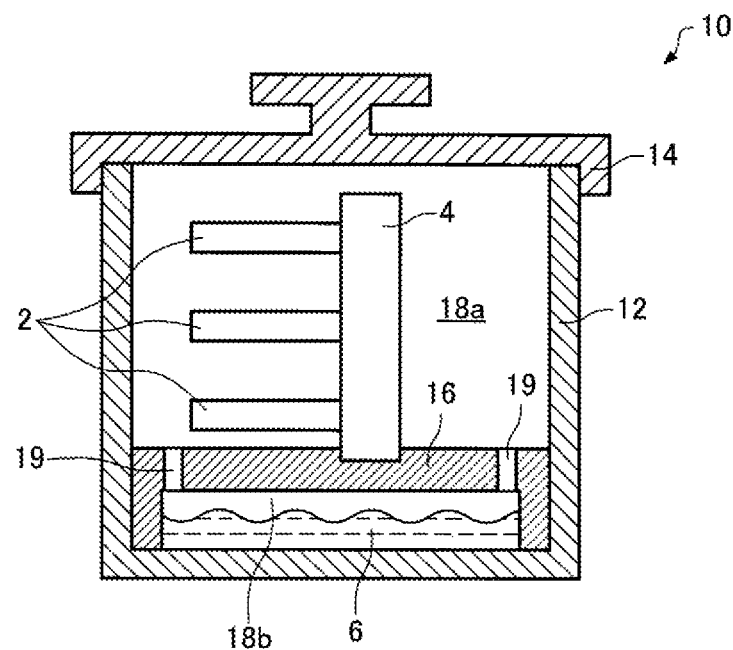
FIG. 2 is a schematic vertical cross section of the sample container shown in FIG. 1.
Figure 3:
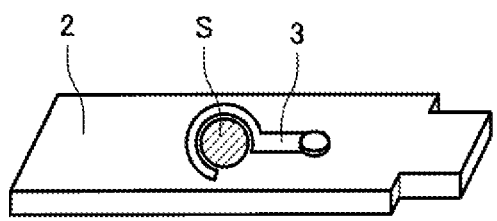
FIG. 3 is a schematic perspective view of one of the cartridges shown in FIGS. 1 and 2.
Figure 4:
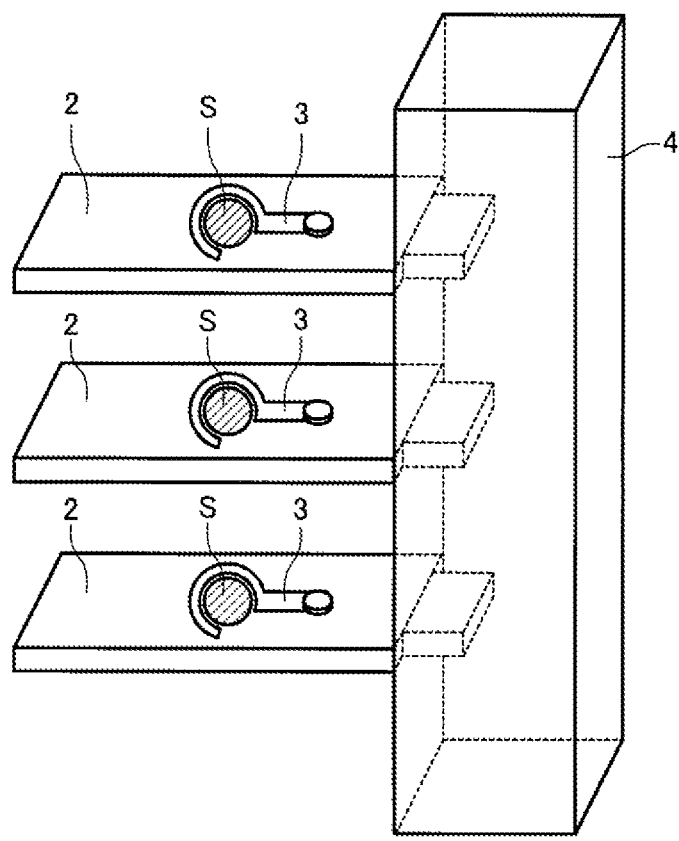
FIG. 4 is a schematic perspective view of the magazine shown in FIGS. 1 and 2, and in which cartridges of the structure shown in FIG. 3 have been mounted to the magazine.

First, the sample container 10 is described. FIG. 2 schematically shows the sample container 10. FIG. 3 is a schematic perspective view of one cartridge 2. FIG. 4 is a schematic perspective view of a magazine 4, and in which cartridges 2 have been mounted to the magazine 4.

The sample container 10 is a receptacle for conveying cooled samples S. The samples S and a refrigerant 6 for cooling the sample S are accommodated in the sample container 10.

As shown in FIG. 2, the sample container 10 accommodates the magazine 4 to which the cartridges 2 are mounted. Each cooled sample S is held to a respective one of the cartridges 2 by an anchoring member 3 as shown in FIG. 3.

Each sample S is a biological sample or a polymeric material whose structure is readily destroyed by a charged particle beam such as an electron beam or ion beam.

The anchoring member 3 is configured including a C-ring or a leaf spring.

Each cartridge 2 is a plate-like member provided with a through-hole. Each sample S is held in the through-hole of a respective one of the cartridges 2 with the securing member 3.

As shown in FIG. 4, the cartridges 2 are mounted to the magazine 4. In the illustrated example, three cartridges 2 are mounted to the magazine 4. Preferably, the cartridges 2 and magazine 4 are made of a thermally conductive material.

The samples S are cooled, for example, below the temperature of liquid nitrogen (such as a cryogenic temperature) and then held to the respective cartridges 2. The cartridges 2 on which the respective samples S are held are mounted to the magazine 4 and carried by the sample container 10. In the present example, the cartridges 2 on which the respective samples S are held are mounted to the magazine 4 and received in the sample container 10. Alternatively, the samples S may be directly received in the sample container 10 without using the cartridges 2 or magazine 4 in an unillustrated manner.

As shown in FIG. 2, the sample container 10 is configured including a receiving portion 12, a cover portion 14, and a thermally conductive member 16.

The receiving portion 12 has a sample-receiving space 18a and a refrigerant-receiving space 18b. In the illustrated example, the magazine 4 to which the cartridges 2 have been mounted is received in the sample-receiving space 18a. The refrigerant 6 is received in the refrigerant-receiving space 18b. As long as the receiving portion 12 can have the sample-receiving space 18a and the refrigerant-receiving space 18b, no restrictions are imposed on the shape or size of the receiving portion 12. For example, the receiving portion 12 is shaped cylindrically and has a top surface with an opening and a closed bottom surface.

The refrigerant 6 is liquid nitrogen, for example. Alternatively, the refrigerant 6 may be liquid methane, liquid ethane, or liquid butane. No restrictions are placed on the refrigerant 6 as long as it can cool the samples S and can be evacuated by vacuum pumping equipment 50 (described later) and solidified.

The cover portion 14 plugs up the opening of the receiving portion 12 to such an extent that, when the refrigerant 6 vaporizes and the pressure inside the sample container 10 increases beyond atmospheric pressure, the vaporizing refrigerant 6 can be expelled from between the receiving portion 12 and the cover portion 14. The cover portion 14 makes it possible to set the pressure inside the sample-receiving space 18a of the sample container 10 higher than atmospheric pressure, thus preventing outside air including moisture from entering the sample container 10. Consequently, it is possible to prevent adhesion of ice contamination (such as crystalline ice or frost) onto the samples S.

The thermally conductive member 16 partitions the sample-receiving space 18a and the refrigerant-receiving space 18b from each other. In the illustrated example, the sample-receiving space 18a is surrounded by the thermally conductive member 16, receiving portion 12, and cover portion 14. The refrigerant-receiving space 18b is surrounded by both thermally conductive member 16 and receiving portion 12. In the illustrated example, of the space partitioned by the thermally conductive member 16 of the receiving portion 12, the sample-receiving space 18a is a space on the opening side of the receiving portion 12 while the refrigerant-receiving space 18b is a space on the bottom side of the receiving portion 12.

The thermally conductive member 16 is used to transfer heat between each sample S and the refrigerant 6. The thermally conductive member 16 is made of a material having a high thermal conductivity such as copper. Alternatively, the thermally conductive member 16 may be made of other metal or an alloy thereof. The magazine 4 is put on the thermally conductive member 16, which in turn transfers heat from the magazine 4 to the refrigerant 6. As a result, the samples S, cartridges 2, and magazine 4 can be cooled.

The thermally conductive member 16 is provided with communication holes 19 for placing the sample-receiving space 18a and the refrigerant-receiving space 18b in communication with each other. In the illustrated example, the communication holes 19 are two in number. The number of the communication holes 19 may also be three or more. The refrigerant 6 can be supplied into the refrigerant-receiving space 18b through the communication holes 19. Also, the refrigerant 6 in vaporized form enters the sample-receiving space 18a through the communication holes 19.

As shown in FIG. 1, the sample container 10 can be connected with the sample exchange chamber 30 while a partition valve 40 is closed. In the illustrated example, the sample container 10 is connected with the sample exchange chamber 30 via a connecting member 42.

The sample container 10 is evacuated by the vacuum pumping equipment 50 while the partition valve 40 is closed. Consequently, the refrigerant-receiving space 18b is evacuated. The freezing point of the refrigerant 6 (such as liquid nitrogen) received in the refrigerant-receiving space 18b rises and the refrigerant 6 solidifies. When the refrigerant 6 solidifies, particulates of the solid refrigerant (such as solid nitrogen) deposit and so gaps are formed among the particulates. This gives rise to an increase in the volume. In the sample container 10, the refrigerant 6 is surrounded by the thermally conductive member 16 and so, if the refrigerant 6 solidifies, its expansion in volume can be suppressed. In consequence, adhesion of the solid refrigerant (such as solid nitrogen) onto the magazine 4, cartridges 2, and samples S can be prevented.

As shown in FIG. 2, the communication holes 19 are located in positions where the solid refrigerant 6 (solid nitrogen) adheres to none of the magazine 4, cartridges 2, and samples S. The size of the communication holes 19 is so determined that the refrigerant 6 in vaporized form can pass through these holes and passage of the solidified refrigerant 6 is limited.

(2) Sample Chamber

The sample chamber 20 is next described. As shown in FIG. 1, the sample chamber 20 is a space inside an electron optical column 22. The sample chamber 20 is defined by the inner wall of the column 22. That is, it can be said that the electron optical column 22 is a vacuum vessel having the sample chamber 20.

The interior of the sample chamber 20 is evacuated (i.e., gas inside the chamber is removed) by the vacuum pumping equipment (not shown). As a result, the sample chamber 20 is maintained at vacuum or subatmospheric pressure. An ion pump, a scroll pump, a turbomolecular pump, or the like can be used as the vacuum pumping equipment for evacuating the sample chamber 20.

A sample holder 26 has a sample holding portion 24 in its front-end portion. The sample holding portion 24 holds a sample S. The sample S held by the sample holding portion 24 is placed in position within the sample chamber 20 by a goniometer 28. In this example, the sample holding portion 24 holds the sample S by holding the cartridge 2 to which the sample S is securely held.

In the sample chamber 20, the charged particle beam (such as an electron beam) is directed at the sample S. In the charged particle beam instrument 100, the sample S held to the sample holding portion 24 is irradiated with the electron beam inside the sample chamber 20. The electron beam transmitted through the sample S is brought to focus by the optical system. Thus, an electron microscope image is obtained. The components such as the optical system of the charged particle beam instrument 100 will be described later in "4. Other Components of the Charged Particle Beam Instrument".

(3) Sample Exchange Device

The sample exchange device 100A is next described. As shown in FIG. 1, this device 100A is so located that the sample exchange device 100A and the goniometer 28 are on the opposite sides of the electron optical column 22. No restrictions are imposed on the position of the sample exchange device 100A as long as the sample S can be exchanged in the sample chamber 20.

As shown in FIG. 1, the sample exchange device 100A is configured including the sample exchange chamber 30, the partition valve 40, the vacuum pumping equipment 50, a sample holding portion 60, a cooling portion 70, a first transfer rod 80, and a second transfer rod 90.

The sample exchange chamber 30 is connected with the sample chamber 20. A partition valve 32 is mounted between the sample exchange chamber 30 and the sample chamber 20. The partition valve 32 is used as a vacuum partition between the sample exchange valve 30 and the sample chamber 20. The sample exchange chamber 30 and the sample chamber 20 are placed in communication with each other by opening the partition valve 32. The sample exchange chamber 30 and the sample chamber 20 are isolated from each other by closing the partition valve 32.

The sample exchange chamber 30 is a space surrounded by a vacuum vessel 34. The sample exchange chamber 30 is evacuated by the vacuum pumping equipment 50. Consequently, the sample exchange chamber 30 can be maintained in vacuum. The sample storage portion 60 is mounted in the sample exchange chamber 30.

The sample container 10 is connected with the sample exchange chamber 30. In the illustrated example, the sample container 10 is connected with the sample exchange chamber 30 via a connecting member 42, which in turn is connected with the sample exchange chamber 30. An O-ring 44 is mounted on the end surface of the connecting member 42. Sealing is provided between the sample container 10 and the connecting member 42 by the O-ring 44.

The partition valve 40 is positioned between the sample exchange chamber 30 and the sample container 10 when the sample container 10 is connected with the sample exchange chamber 30. The partition valve 40 is used as a vacuum partition between the sample exchange chamber 30 and the sample container 10 (i.e., the sample-receiving space 18a). The sample exchange chamber 30 and the sample container 10 (i.e., the sample-receiving space 18a) are placed in communication with each other by opening the partition valve 40. The sample exchange chamber 30 and the sample container 10 (i.e., the sample-receiving space 18a) are isolated from each other by closing the partition valve 40.

The vacuum pumping equipment 50 evacuates the sample container 10. The vacuum pumping equipment 50 can evacuate the sample container 10 under the conditions where the sample container 10 is connected with the sample exchange device 30 and the partition valve 40 is closed. As a consequence, the sample-receiving space 18a and refrigerant-receiving space 18b of the sample container 10 are evacuated. The freezing point of the refrigerant 6 (such as liquid nitrogen) received in the refrigerant-receiving space 18b rises, and the refrigerant 6 can be solidified. The vacuum pumping equipment 50 can also evacuate the sample container 10 while the partition valve 40 is open.

The vacuum pumping equipment 50 evacuates the sample container 10 via an exhaust tube 52. In the illustrated example, the exhaust tube 52 is connected with the connecting member 42. A solenoid valve 54 is mounted in the exhaust tube 52.

Furthermore, the vacuum pumping equipment 50 evacuates the sample exchange chamber 30 via an exhaust tube 56. A solenoid valve 58 is mounted in the exhaust tube 56.

An oil-sealed rotary vacuum pump, an ion pump, a scroll pump, a turbomolecular pump, or the like can be used as the vacuum pumping equipment 50.

The sample holding portion 60 is formed in the sample exchange chamber 30 and can hold a plurality of samples S. In the illustrated example, the sample holding portion 60 holds the plural cartridges 2 to which the samples S are held. For example, the sample holding portion 60 is similar in configuration to the magazine 4.

The sample holding portion 60 is cooled by the cooling portion 70. Accordingly, the samples S can be stored while kept cooled. The sample storage portion 60 is made, for example, of a material of high thermal conductivity.

The cooling portion 70 cools the sample storage portion 60. The cooling portion 70 is configured including a refrigerant tank 72 (such as a tank holding liquid nitrogen) and a thermally conductive member 74a that thermally interconnects the tank 72 and the sample storage portion 60. The cooling portion 70 cools the thermally conductive member 74a with the refrigerant put in the tank 72, thus cooling the sample storage portion 60.

Furthermore, the cooling portion 70 cools the first transfer rod 80 and the second transfer rod 90. In addition, the cooling portion 70 includes a thermally conductive member 74b for thermally coupling together the tank 72 and the first transfer rod 80 and a thermally conductive member 74c for thermally coupling together the tank 72 and the second transfer rod 90. Each of the thermally conductive members 74a, 74b, and 74c is made, for example, of copper wire.

The first transfer rod 80 carries the samples S between the sample container 10 and the sample exchange chamber 30 by holding and carrying the magazine 4. In particular, the first transfer rod 80 can grip the magazine 4 at its front end and move the magazine 4 in the Z-direction. The first transfer rod 80 conveys the magazine 4 into the sample exchange chamber 30 by gripping the magazine 4 within the sample container 10 and moving the magazine in the +Z-direction. Furthermore, the first transfer rod 80 can convey the magazine 4 (and the samples S) within the sample exchange chamber 30 into the sample container 10.

The first transfer rod 80 is cooled by the cooling portion 70. Therefore, if the first transfer rod 80 touches the cooled magazine 4, the temperature of the magazine 4 can be maintained.

The second transfer rod 90 carries the samples S between the first transfer rod 80 and the sample storage portion 60. In this example, the second transfer rod 90 transports the samples S by holding and carrying the cartridges 2 to which the samples S are held. Specifically, the second transfer rod 90 can grip the cartridge 2 at its front end and move the gripped cartridge 2 in the X-direction. The second transfer rod 90 carries the cartridge 2 into the sample storage portion 60 by taking the cartridge 2 out of the magazine 4 held by the first transfer rod 80 and moving the cartridge 2 in the −X-direction. Furthermore, the second transfer rod 90 can take the cartridge 2 out of the sample storage portion 60 and transfer the cartridge 2 to the magazine 4 held by the first transfer rod 80.

Additionally, the second transfer rod 90 conveys the samples S between the sample storage portion 60 and the sample chamber 20. The second transfer rod 90 transports the cartridges 2 into the sample chamber 20 by taking the cartridges 2 out of the sample storage portion 60 and moving the cartridges 2 in the +X-direction. In the illustrated example, the second transfer rod 90 carries the samples S into the sample holding portion 24 within the sample chamber 20. Also, the second transfer rod 90 can convey the cartridges 2 (and the samples S) from the sample chamber 20 into the sample storage portion 60.

Further, the second transfer rod 90 conveys the samples S between the sample chamber 20 and the first transfer rod 80. The second transfer rod 90 transports the cartridges 2 to the first transfer rod 80 by taking the cartridges 2 out of the sample chamber 20 (sample holding portion 24) and moving the cartridges in the −X-direction. The second transfer rod 90 can convey the cartridges 2 (and the samples S) from the first transfer rod 80 into the sample chamber 20.

The second transfer rod 90 is cooled by the cooling portion 70 and, therefore, if this rod 90 touches the cooled cartridges 2, the temperature of the cartridges 2 can be maintained.

2. Operation of the Charged Particle Beam Instrument

The operation of the charged particle beam instrument 100 is next described by referring to FIGS. 5-11. In particular, a method of introducing the samples S from the sample container 10 into the sample chamber 20, a method of returning the samples S from the sample chamber 20 into the sample container 10, and a method of using the sample storage portion 60 are described. It is now assumed that liquid nitrogen is used as the refrigerant 6.

(1) Introduction of Samples into the Sample Chamber

The method of introducing the samples S from the sample container 10 into the sample chamber 20 is first described.

As shown in FIG. 3, a cooled sample S is securely held to the cartridge 2 by the anchoring member 3.

Then, as shown in FIG. 4, as many cartridges 2 to which respective samples S are securely attached as needed are mounted to the magazine 4.

As shown in FIG. 2, the magazine 4 to which the cartridges 2 are attached is received into the sample-receiving space 18a of the sample container 10 previously cooled by the refrigerant 6. The poured refrigerant 6 flows into the refrigerant-receiving space 18b formed in the bottom of the sample container 10 through the communication holes 19 in the thermally conductive member 16 of the sample container 10 and stays in this space 18b.

Then, the cover portion 14 of the sample container 10 is closed to prevent outside air containing moisture from entering the sample container 10. Under this condition, the sample container 10 is conveyed into the sample exchange device 100A. By receiving the samples S in the sample container 10 and conveying the container together with the samples in this way, the samples S can be conveyed while cooling the samples S such that ice contamination (such as crystalline ice or frost) does not adhere to the surfaces of the samples S.

Then, as shown in FIG. 1, the sample container 10 is mounted to the sample exchange device 100A. In particular, the cover portion 14 of the sample container 10 is removed, and the sample container 10 is attached to the connecting member 42. The sample container 10 is connected with the sample exchange chamber 30 via the partition valve 40. At this time, the partition valve 40 is closed. Sealing is provided between the connecting member 42 and the sample container 10 by the O-ring 44.

In the sample exchange device 100A, the interior of the sample exchange chamber 30 has been previously evacuated by the vacuum pumping equipment 50 and maintained in vacuum. That is, the solenoid valve 58 is kept open. The first transfer rod 80, second transfer rod 90, and sample storage portion 60 are always cooled by the cooling portion 70. The partition valve 32 is kept closed.

When the sample container 10 is mounted, the solenoid valve 54 is opened and the interior of the sample container 10 is evacuated. The solenoid valve 54 may be operated either manually or automatically.

When the interior of the sample container 10 is evacuated, the freezing point of the refrigerant 6 in the refrigerant-receiving space 18b rises and thus the refrigerant becomes solidified. At this time, solid particles of the refrigerant (such as solid nitrogen) deposit and so the refrigerant 6 expands in volume. However, in the sample container 10, the refrigerant 6 is surrounded by the thermally conductive member 16. Therefore, if the refrigerant 6 solidifies, expansion of the volume can be suppressed. Adhesion of the solid refrigerant (such as solid nitrogen) to the magazine 4, cartridges 2, and samples S can be prevented.

Figure 5:
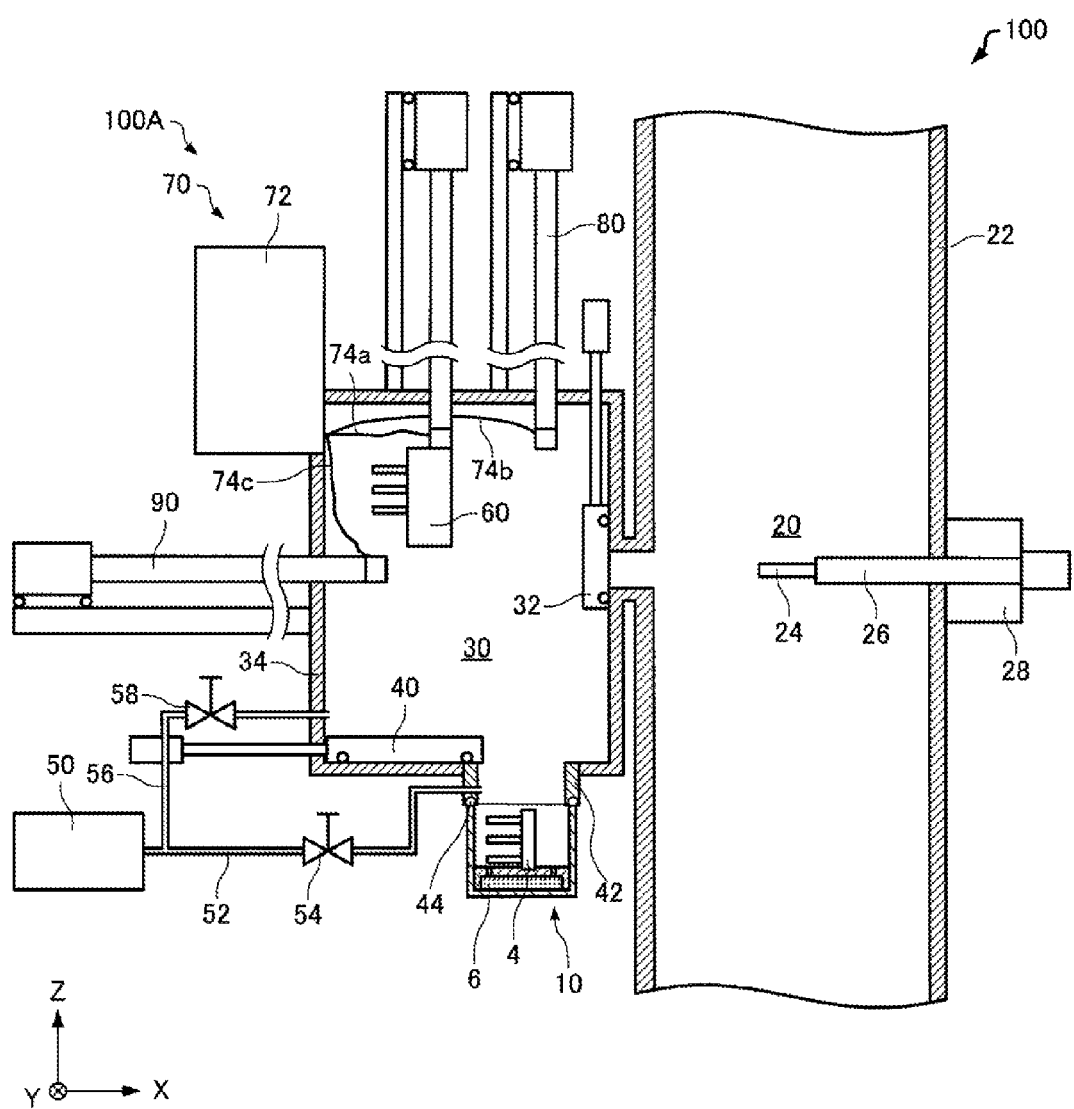
FIGS. 5-11 are vertical cross sections similar to FIG. 1, but showing different operative conditions of the charged particle beam instrument for illustrating the operation.

As shown in FIG. 5, after the interior of the sample container 10 is evacuated and the solenoid valve 54 is closed, the partition valve 40 is opened. At this time, the refrigerant 6 in the sample container 10 is in solidified form. Therefore, if the refrigerant 6 is left in the container 10, deterioration of the degree of vacuum in the sample exchange chamber 30 can be suppressed.

Figure 6:
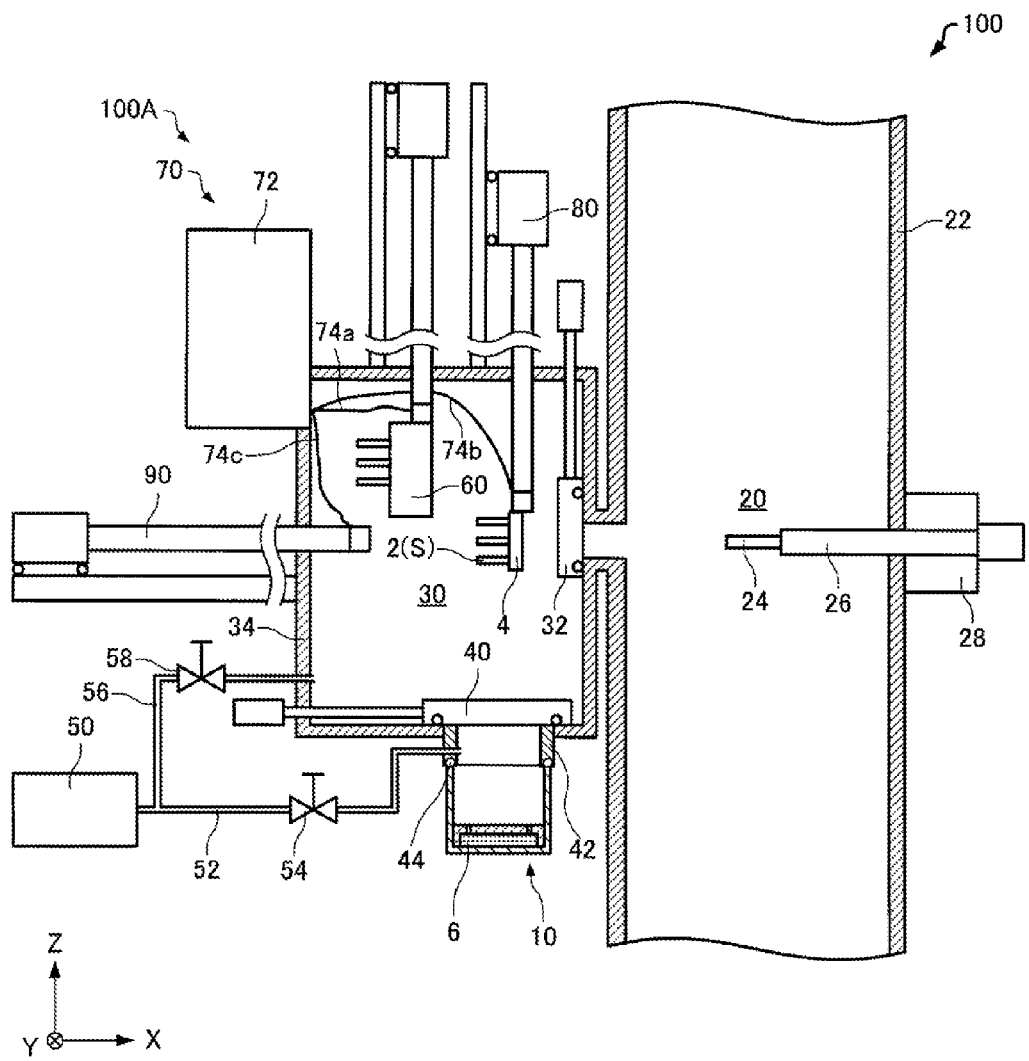

As shown in FIG. 6, the magazine 4 is gripped by the first transfer rod 80, the rod 80 is moved in the +Z-direction, and the magazine 4 is carried into the sample exchange chamber 30 from inside the sample container 10. The partition valve 40 is then closed.

Figure 7:
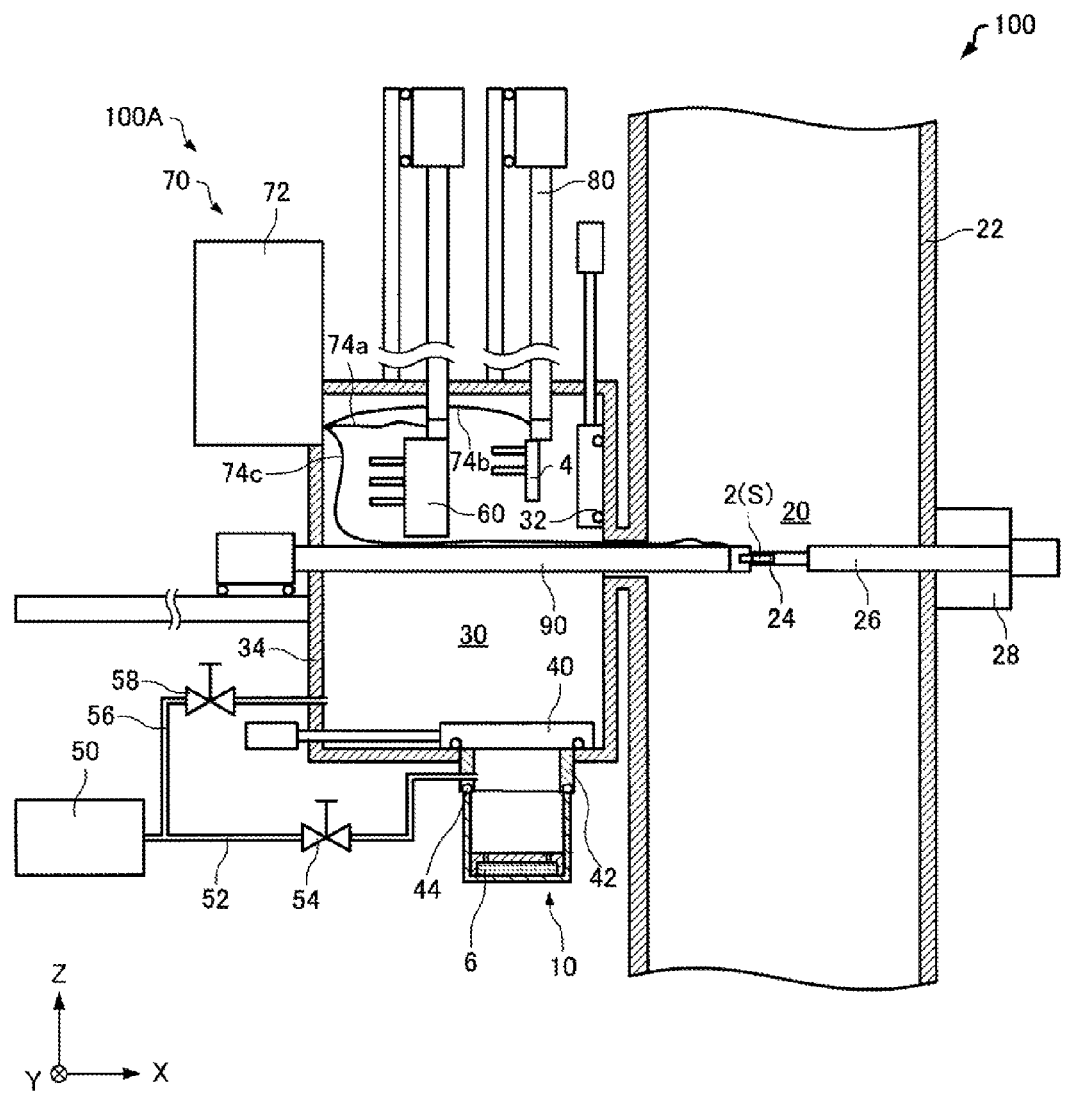

As shown in FIG. 7, one cartridge 2 is taken out of the magazine 4 held by the first transfer rod 80, using the second transfer rod 90. The partition valve 32 is opened. The first transfer rod 80 is moved in the +X-direction. The cartridge 2 and the sample S are introduced into the sample chamber 20. The cartridge 2 is held to the sample holding portion 24.

This permits the sample S to be introduced from the sample container 10 into the sample chamber 20.

Figure 8:
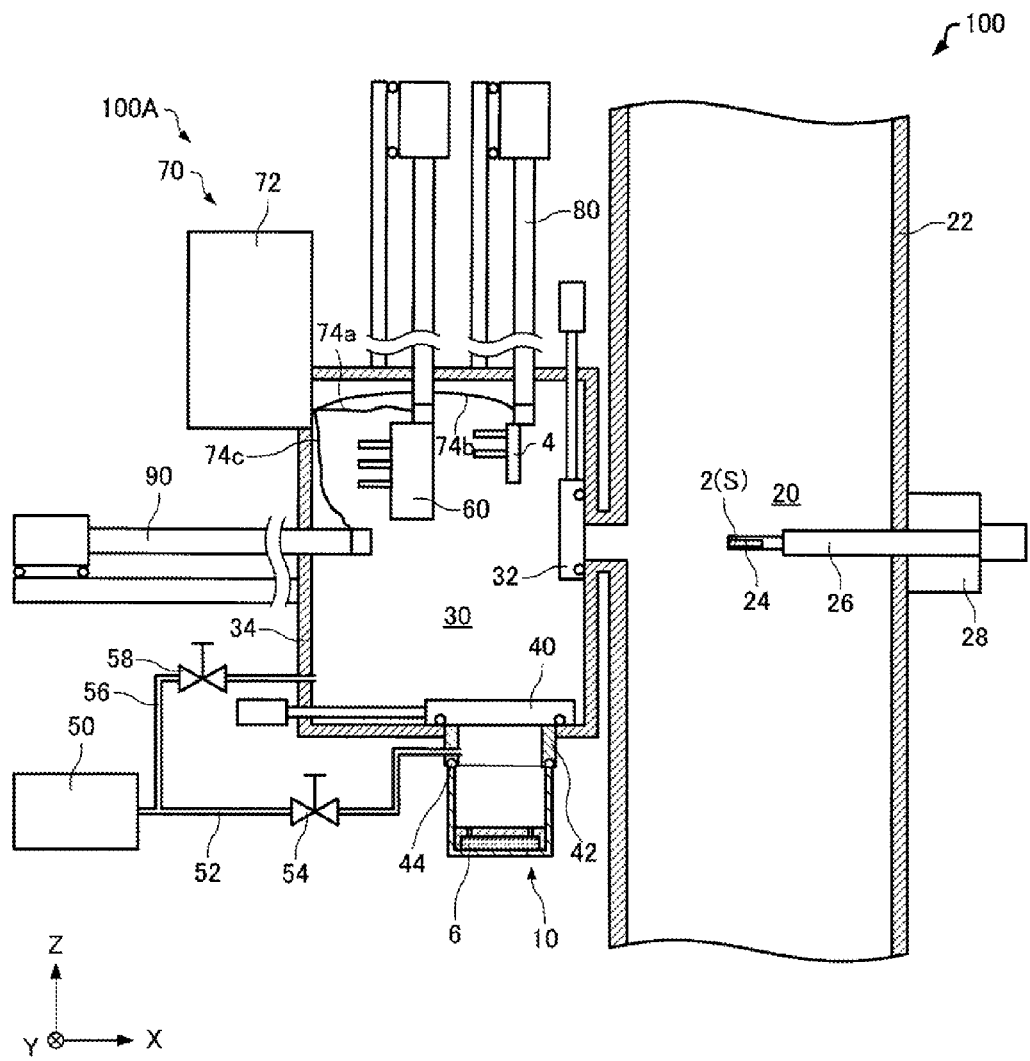

Then, as shown in FIG. 8, the second transfer rod 90 is returned to its original position, the partition valve 32 is closed, and the sample S is started to be observed.

(2) Takeout of Sample

Then, an operation for taking out the sample S from the sample chamber 20 and returning it into the sample container 10 is next described.

As shown in FIG. 7, the partition valve 32 is opened. Then, one cartridge 2 and the sample S held to the sample holding portion 24 are gripped by the second transfer rod 90.

As shown in FIG. 6, the second transfer rod 90 gripping the cartridge 2 is moved in the −X-direction to convey the cartridge 2 from the sample chamber 20 into the sample exchange chamber 30. The partition valve 32 is then closed. Subsequently, the cartridge 2 gripped by the second transfer rod 90 is attached to the magazine 4 gripped by the first transfer rod 80.

Then, the solenoid valve 54 is opened. The interior of the sample container 10 is evacuated to solidify the refrigerant 6. The solenoid valve 54 is closed and then the partition valve 40 is opened. At this time, the refrigerant 6 inside the sample container 10 is in solidified form and so deterioration of the degree of vacuum in the sample exchange chamber 30 can be suppressed even if the refrigerant 6 is left in the container 10.

As shown in FIG. 5, the first transfer rod 80 gripping the magazine 4 is moved in the −Z-direction to carry the magazine 4 from the sample exchange chamber 30 into the sample container 10. Then, the partition valve 40 is closed.

In this way, the sample S can be returned from the sample chamber 20 into the sample container 10.

After being brought back to atmospheric pressure by vaporization of the refrigerant 6 and supply of nitrogen gas, the sample container 10 is removed from the sample exchange device 100A and the cover portion 14 is closed.

(3) Use of the Sample Holding Portion

A method of using the sample storage portion 60 is next described. There are two cases. In one case, a sample S already observed is kept in the sample storage portion 60. In the other case, a sample S is conveyed from the sample storage portion 60 into the sample container 10.

As shown in FIG. 7, after observation of the sample S is finished, the partition valve 32 is opened. Then, one cartridge 2 and the sample S held in the sample holding portion 24 are gripped by the second transfer rod 90.

Figure 9:
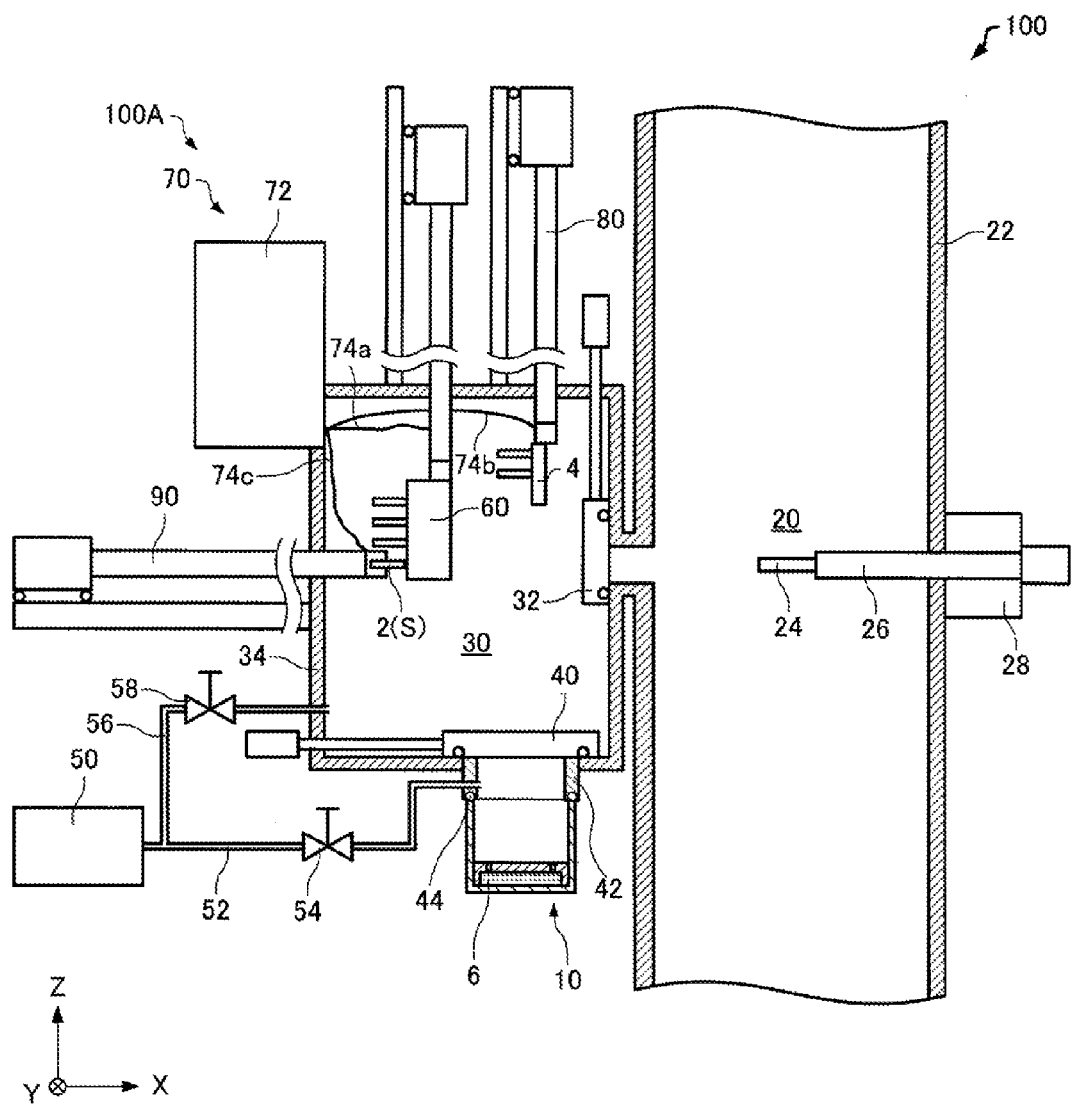

As shown in FIG. 9, the second transfer rod 90 gripping the cartridge 2 is moved in the −X-direction to convey the cartridge 2 from the sample chamber 20 into the sample exchange chamber 30. Then, the partition valve 32 is closed. Subsequently, the cartridge 2 gripped by the second transfer rod 90 is attached to the sample storage portion 60. In the illustrated example, the sample storage portion 60 can be placed in a range where the second transfer rod 90 can move the cartridge 2 (and the sample S) by moving the sample storage portion 60 in the −Z-direction.

Figure 10:
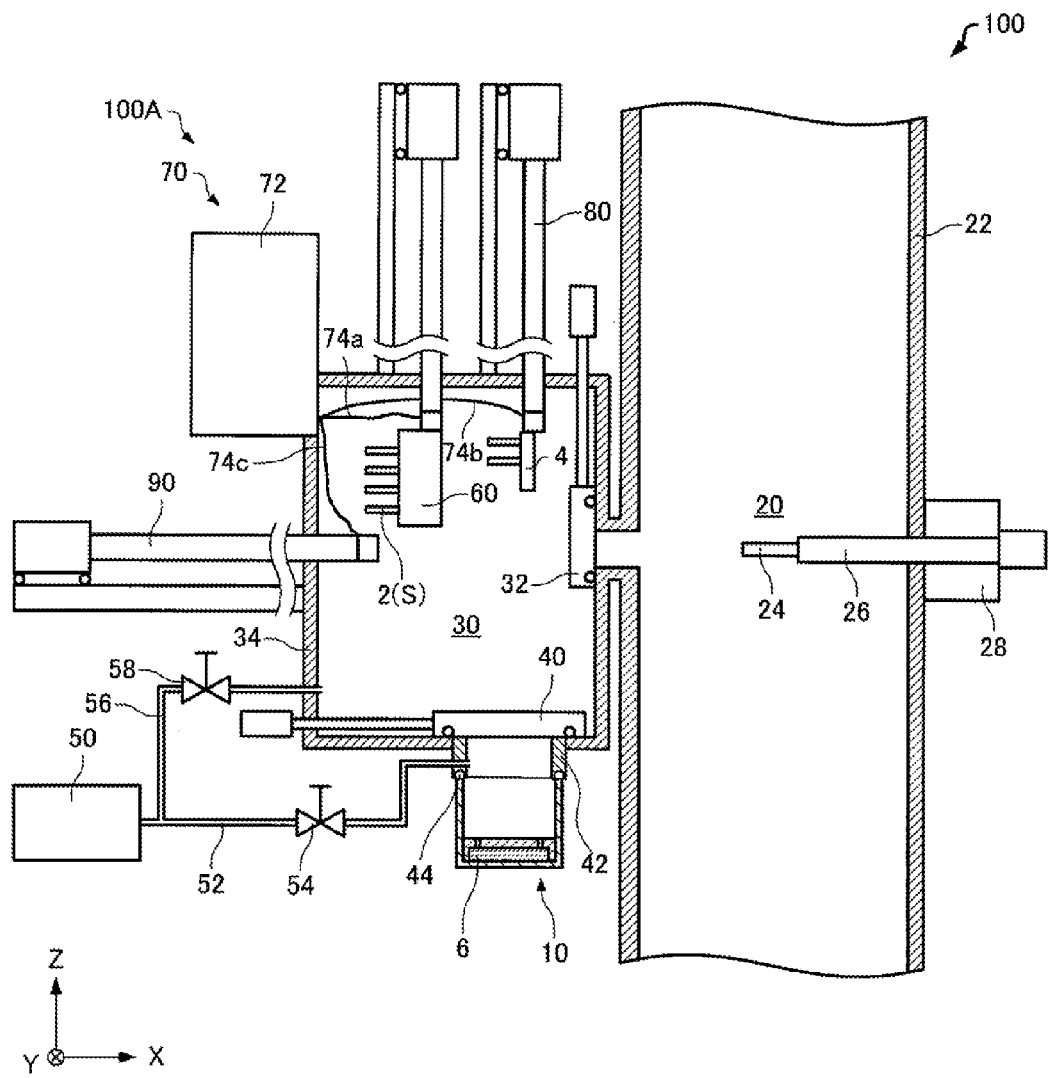

As shown in FIG. 10, the sample storage portion 60 is returned to its original position. That is, the sample storage portion 60 is moved into a position where the operation of the second transfer rod 90 is not hindered.

In this way, each sample S which has been already observed can be kept in the sample storage portion 60.

Where a sample S stored in the sample storage portion 60 is introduced into the sample chamber 20, a procedure opposite to the foregoing procedure is adopted.

A case in which a sample S is conveyed from the sample storage portion 60 into the sample container 10 is next described.

As shown in FIG. 9, the sample storage portion 60 is moved in the −Z-direction, and the cartridge 2 attached to the sample storage portion 60 is gripped by the second transfer rod 90.

Figure 11:
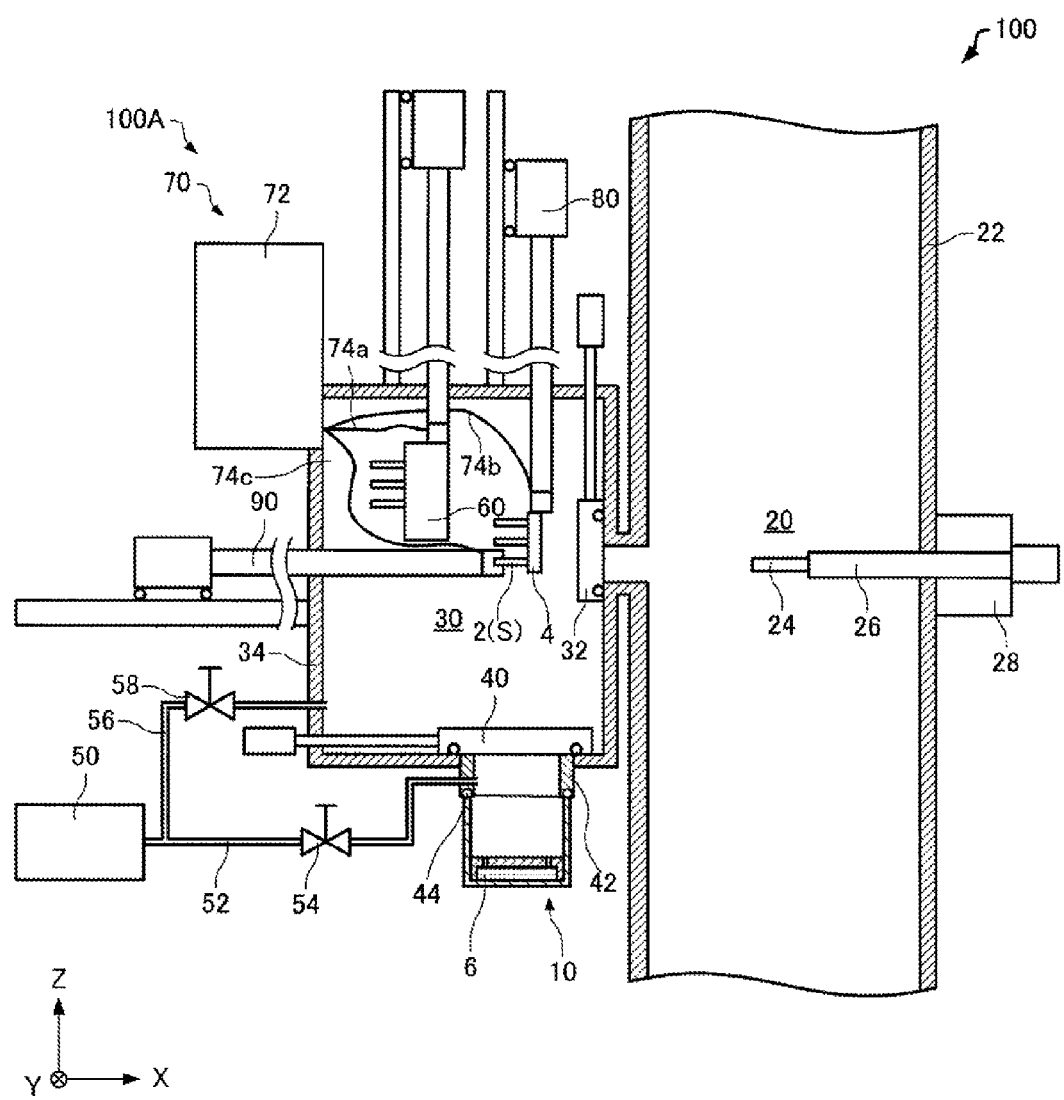

As shown in FIG. 11, the second transfer rod 90 gripping the cartridge 2 is moved in the +X-direction to mount the cartridge 2 to the magazine 4 held by the first transfer rod 80.

As shown in FIG. 5, the partition valve 40 is opened. The first transfer rod 80 gripping the magazine 4 is moved in the −Z-direction to carry the magazine 4 from the sample exchange chamber 30 into the sample container 10. Then, the partition valve 40 is closed.

Consequently, the sample S can be returned from the sample storage portion 60 into the sample container 10.

After being brought back to atmospheric pressure by vaporization of the refrigerant 6 and supply of nitrogen gas, the sample container 10 is removed from the sample exchange device 100A. The cover portion 14 is closed.

Where the sample S is conveyed from the sample container 10 to the sample storage portion 60, a procedure opposite to the foregoing procedure is followed.

The charged particle beam instrument 100 and the sample container 10 have the following features.

In the charged particle beam instrument 100, the sample container 10 can be connected with the sample exchange chamber 30 via the partition valve 40. The container 10 is evacuated by the vacuum pumping equipment 50 while the partition valve 40 is closed. Therefore, the partition valve 40 can be opened after the interior of the sample container 10 is evacuated and the refrigerant 6 is solidified. Consequently, if the refrigerant 6 is left in the container 10, the sample S can be introduced into the sample exchange chamber 30 from the sample container 10. This permits the sample S to be introduced into the sample chamber 20 easily via the sample exchange chamber 30.

Figure 12:
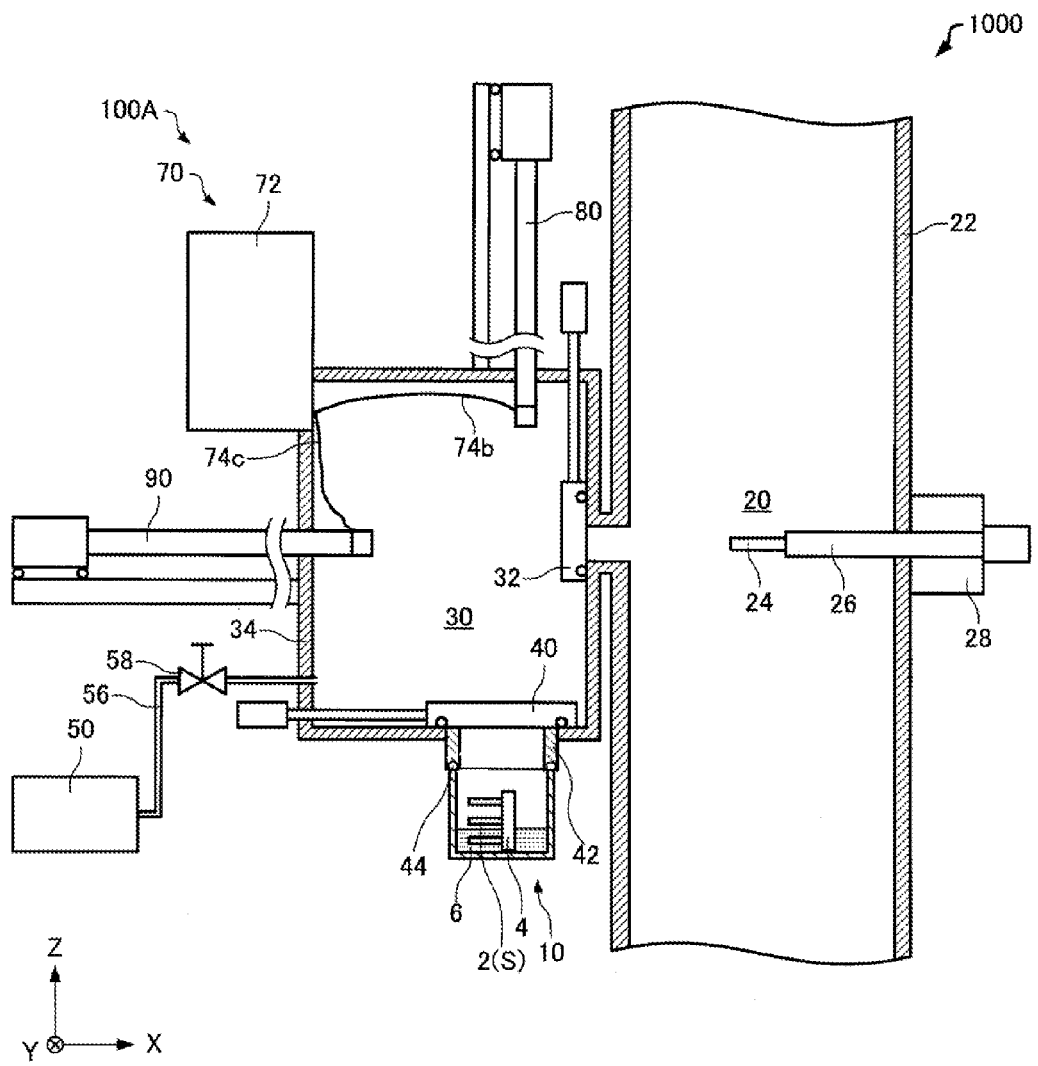
FIG. 12 is a vertical cross section, party in block form, of main portions of a known charged particle beam instrument providing a reference.

FIG. 12 shows the configuration of a known charged particle beam instrument, 1000, providing a reference. In this instrument 1000, a sample container 10 cannot be evacuated if a partition valve 40 is closed. Therefore, when a sample S is introduced into a sample chamber 20 from the sample container 10, the interior of a sample exchange chamber 30 is returned to atmospheric pressure, for example, using nitrogen gas. Then, the partition valve 40 is opened to vaporize refrigerant 6 (such as liquid nitrogen) inside the sample container 10. After the refrigerant 6 is fully vaporized, one sample S inside the sample container 10 is introduced into the sample exchange chamber 30 with a first transfer rod 80. The partition valve 40 is then closed. The interior of the sample exchange chamber 30 is evacuated and then a partition valve 32 is opened. The sample S is introduced into the sample chamber 20. In this known charged particle beam instrument 1000, the sample container 10 does not have any thermally conductive member like the thermally conductive member 16 shown in FIG. 2. A magazine 4 and the refrigerant 6 are accommodated in the same space.

In this way, in the known charged particle beam instrument 1000 providing a reference, the sample exchange chamber 30 must be brought to atmospheric pressure in order to introduce the sample S from the sample container 10 into the sample chamber 20. Similarly, in this known instrument 1000, the sample exchange chamber 30 must be brought to atmospheric pressure in order to return the sample S from the sample chamber 20 into the sample container 10. In contrast, in the inventive charged particle beam instrument 100, the sample S can be introduced into the sample exchange chamber 30 from the sample container 10 without bringing the sample exchange chamber 30 to atmospheric pressure if the refrigerant 6 is left in the sample container 10.

Furthermore, in the inventive charged particle beam instrument 100, the sample S can be introduced from the sample container 10 into the sample chamber 20 and thence returned into the sample container 10 without bringing the sample exchange chamber 30 to atmospheric pressure, i.e., the vacuum state is maintained. Therefore, the sample S cooled under vacuum can be stored in the sample storage portion 60. Consequently, the sample S can be kept at low temperatures in the sample storage portion 60.

In the known charged particle beam instrument 1000 shown in FIG. 12, if the sample storage portion 60 reaches atmospheric pressure when the sample S is introduced into the sample chamber 20, the effects of vacuum insulation are not obtained. It is difficult to maintain the sample S stored in the sample storage portion 60 at low temperatures at all times.

In the inventive charged particle beam instrument 100, the sample container 10 has the thermally conductive member 16 that isolates the sample-receiving space 18a accommodating the samples S therein and the refrigerant-receiving space 18b accommodating the refrigerant 6 therein from each other. The thermally conductive member 16 is provided with the communication holes 19 that place the sample-receiving space 18a and the refrigerant-receiving space 18b in communication with each other. This can prevent adhesion of solid refrigerant (such as solid nitrogen) onto the magazine 4, cartridges 2, and samples S.

The charged particle beam instrument 100 includes: the sample storage portion 60 formed in the sample exchange chamber 30 and capable of holding the samples S; and the cooling portion 70 for cooling the sample storage portion 60. Consequently, the samples S can be stored while cooled. Furthermore, in the charged particle beam instrument 100, the samples S cooled under vacuum can be stored in the sample storage portion 60 as described previously. This permits the sample S to be kept at low temperatures in the sample storage portion 60. Moreover, where plural samples S are observed, the labor to exchange the samples S can be alleviated.

The charged particle beam instrument 100 includes the first transfer rod 80 for transferring each sample S between the sample container 10 and the sample exchange chamber 30 and the second transfer rod 90 for transferring each sample S between the first transfer rod 80 and the sample storage portion 60. Consequently, each sample S can be conveyed from the sample container 10 to the sample storage portion 60, and vice versa.

In the charged particle beam instrument 100, the second transfer rod 90 further conveys the sample S between the sample storage portion 60 and the sample chamber 20. Consequently, the sample S can be conveyed either from the sample container 10 or from the sample storage portion 60 into the sample chamber 20, and vice versa.

In the charged particle beam instrument 100, the refrigerant 6 is evacuated by the vacuum pumping equipment 50 and solidifies. As a consequence, as described previously, the sample S can be easily introduced into the sample chamber 20. The refrigerant 6 may be any one of liquid nitrogen, liquid methane, liquid ethane, and liquid butane. Thus, the refrigerant 6 can be solidified by evacuating the sample container 10.

The sample container 10 has the thermally conductive member 16 that partitions the sample-receiving space 18a accommodating each sample S therein and the refrigerant-receiving space 18b accommodating the refrigerant 6 therein from each other. The thermally conductive member 16 is provided with the communication holes 19 that place the sample-receiving space 18a and the refrigerant-receiving space 18b in communication with each other. Consequently, when the sample container 10 is evacuated and the refrigerant 6 is solidified, adhesion of the solid refrigerant (such as solid nitrogen) onto the magazine 4, cartridges 2, and samples S can be prevented.

4. Other Components of the Charged Particle Beam Instrument

Figure 13:
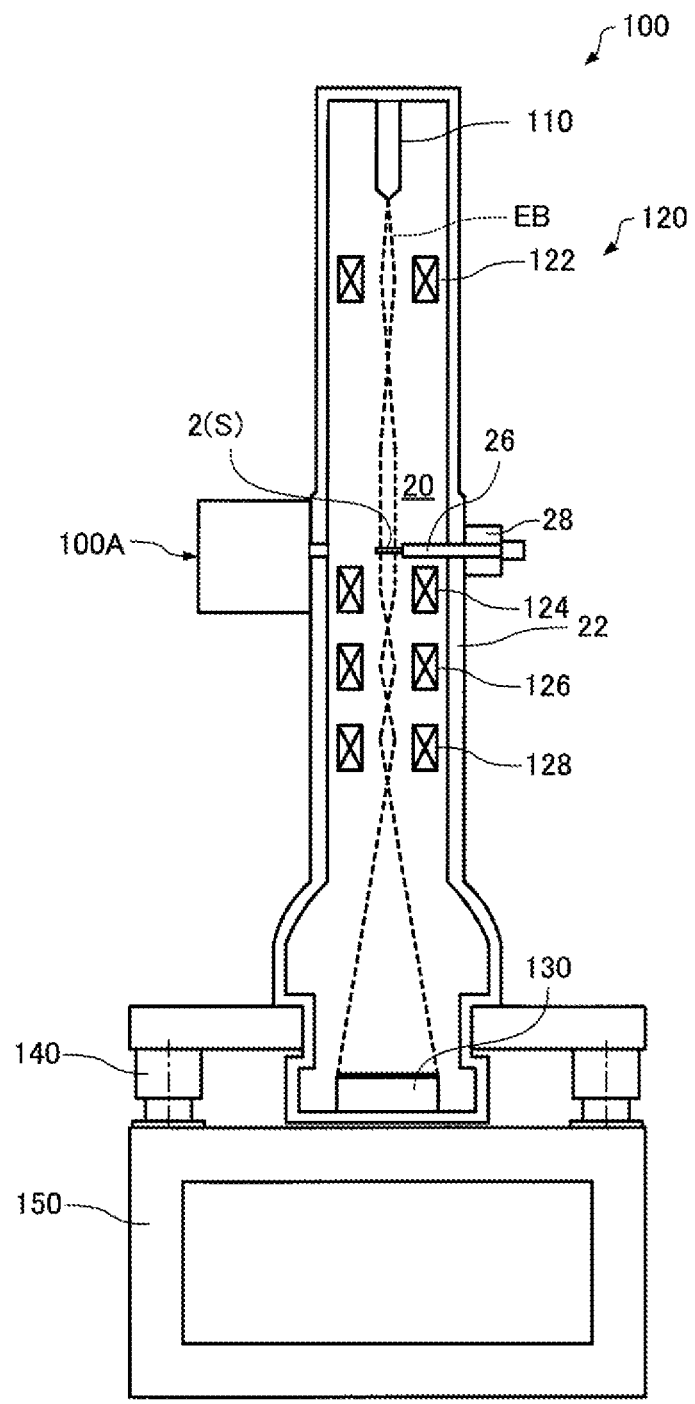
FIG. 13 is a vertical cross section of the charged particle beam instrument shown in FIG. 1, showing other components.

The components of the charged particle beam instrument 100 other than the sample exchange device 100A are next described by referring to FIG. 13, which shows the configuration of the charged particle beam instrument 100. In FIG. 13, the sample exchange device 100A is schematically shown for the sake of convenience.

As shown in FIG. 13, the charged particle beam instrument 100 is configured including a charged particle beam source 110, an optical system 120, and an imaging device 130.

The charged particle beam source 110 emits a charged particle beam (such as an electron beam) EB. A well-known electron gun can be used as the charged particle beam source 110. No restrictions are placed on the electron gun used as the charged particle beam source 110. For example, a thermionic electron gun, thermal field-emission electron gun, or cold field emission electron gun can be used.

The optical system 120 is configured including an illumination lens 122 for directing the electron beam EB at a sample S, an objective lens 124 constituting an imaging system for focusing the electron beam EB transmitted through the sample S, an intermediate lens 126, and a projector lens 128.

The imaging device 130 creates an electron microscope image from the electron beam focused by the imaging system including the lenses 124, 126, and 128. The imaging device 130 is configured including a CCD camera, for example, having a two-dimensional array of solid-state imaging elements. The imaging device 130 takes an electron microscope image and outputs information about this electron microscope image.

In the illustrated example, the charged particle beam instrument 100 is mounted on a pedestal 150 via vibration isolators 140.

In the above-described embodiment, the charged particle beam instrument is a transmission electron microscope. No restrictions are placed on the charged particle beam instrument associated with the present invention as long as the instrument uses a charged particle beam of electrons or ions. The charged particle beam instrument associated with the present invention may be an electron microscope (such as a scanning transmission electron microscope (STEM) or a scanning electron microscope (SEM)), an electron probe microanalyzer (EPMA), a focused ion beam (FIB) instrument, an electron beam exposure system, or the like.

The present invention embraces configurations (e.g., configurations identical in function, method, and results or identical in purpose and advantageous effects) which are substantially identical to the configurations described in connection with the above embodiment. Furthermore, the invention embraces configurations which are similar to the configurations described in connection with the above embodiment except that their nonessential portions have been replaced. Additionally, the invention embraces configurations which are identical in advantageous effects to, or which can achieve the same object as, the configurations described in connection with the above embodiment. Further, the invention embraces configurations which are similar to the configurations described in connection with the above embodiment except that a well-known technique is added.

Having thus described my invention with the detail and particularity required by the Patent Laws, what is desired protected by Letters Patent is set forth in the following claims.

The invention claimed is:

1. A charged particle beam instrument comprising:
a sample container that accommodates samples and a refrigerant for cooling the samples;
an evacuated sample chamber;
a sample exchange chamber connected with the sample chamber;
a partition valve disposed between the sample exchange chamber and the sample container; and
vacuum pumping equipment for evacuating the sample container;
wherein the sample container can be connected by connecting means with the sample exchange chamber and brought into communication with the sample exchange chamber via the partition valve and can be evacuated by the vacuum pumping equipment while the partition valve is closed wherein said sample container has a sample-receiving space for receiving the samples, a liquefied gas refrigerant-receiving space for receiving the refrigerant, and a thermally conductive member that partitions the sample-receiving space and the refrigerant-receiving space from each other, and wherein the thermally conductive member is provided with communication holes for placing the sample-receiving space and the refrigerant-receiving space in communication with each other, such that when said refrigerant-receiving space is evacuated by said vacuum pumping equipment the refrigerant becomes solidified.

2. The charged particle beam instrument as set forth in claim 1, wherein said sample exchange chamber has a sample storage portion capable of holding the samples, and wherein there is further provided a cooling portion for cooling the sample storage portion.

3. The charged particle beam instrument as set forth in claim 2, further comprising a first transfer rod for conveying the samples between said sample container and said sample exchange chamber and a second transfer rod for conveying the samples between the first transfer rod and the sample storage portion.

4. The charged particle beam instrument as set forth in claim 3, wherein said second transfer rod further operates to convey the samples between said sample storage portion and said sample chamber.

5. The charged particle beam instrument as set forth in claim 1, wherein said refrigerant is any one of liquid nitrogen, liquid methane, liquid ethane, and liquid butane.

6. A sample container capable of being connected via a partition valve with a sample exchange chamber in a charged particle beam instrument, said sample container comprising:
a sample-receiving space for receiving samples;
a refrigerant-receiving space for receiving a refrigerant; and
a thermally conductive member that partitions the sample-receiving space and the refrigerant-receiving space from each other, the thermally conductive member being provided with communication holes for placing the sample-receiving space and the refrigerant-receiving space in communication with each other such that when said refrigerant-receiving space is evacuated the refrigerant is solidified.

7. The sample container as set forth in claim 6, wherein said refrigerant is any one of liquid nitrogen, liquid methane, liquid ethane, and liquid butane.

\* \* \* \* \*